(12) United States Patent
Geske et al.

(10) Patent No.: US 11,676,976 B2
(45) Date of Patent: *Jun. 13, 2023

(54) PIN PHOTODETECTOR

(71) Applicant: Attollo Engineering, LLC, Camarillo, CA (US)

(72) Inventors: Jonathan Geske, Ventura, CA (US); Andrew Hood, Ventura, CA (US); Michael MacDougal, Camarillo, CA (US)

(73) Assignee: Attollo Engineering, LLC, Camarillo, CA (US)

( * ) Notice: Subject to any disclaimer, the term of this patent is extended or adjusted under 35 U.S.C. 154(b) by 68 days.

This patent is subject to a terminal disclaimer.

(21) Appl. No.: 17/086,528

(22) Filed: Nov. 2, 2020

(65) Prior Publication Data

US 2021/0082973 A1 Mar. 18, 2021

Related U.S. Application Data

(63) Continuation of application No. 16/166,016, filed on Oct. 19, 2018, now Pat. No. 10,854,646.

(51) Int. Cl.
*H01L 27/144* (2006.01)
*H01L 31/02* (2006.01)
(Continued)

(52) U.S. Cl.
CPC ...... *H01L 27/1446* (2013.01); *H01L 31/0203* (2013.01); *H01L 31/02005* (2013.01);
(Continued)

(58) Field of Classification Search
CPC ....... H01L 31/035281; H01L 31/03529; H01L 31/02005; H01L 31/02019; H01L 31/0203; H01L 31/105; H01L 27/1446
See application file for complete search history.

(56) References Cited

U.S. PATENT DOCUMENTS

| 4,127,932 A | 12/1978 | Hartman et al. |
| 5,001,355 A | 3/1991 | Rosen et al. |

(Continued)

FOREIGN PATENT DOCUMENTS

| FR | 3080489 A1 | 10/2019 |
| JP | 2009016729 A | 1/2009 |

(Continued)

OTHER PUBLICATIONS

PIN diode—Wikipedia, https://en.wikipedia.org/wiki/PIN_diode, 5 pages, last viewed on Sep. 27, 2018.

(Continued)

*Primary Examiner* — Victoria K. Hall
(74) *Attorney, Agent, or Firm* — Billion & Armitage

(57) ABSTRACT

A PIN photodetector includes an n-type semiconductor layer, an n-type semiconductor cap layer, a first plurality of p-type regions located within the n-type semiconductor cap layer and separated from one another by a distance $d_1$, and an absorber layer located between the n-type semiconductor layer and the n-type semiconductor cap layer including the first plurality of p-type regions. The plurality of p-type regions are electrically connected to one another to provide an electrical response to light incident to the PIN photodetector.

19 Claims, 5 Drawing Sheets

(51) Int. Cl.
*H01L 31/105* (2006.01)
*H01L 31/0203* (2014.01)
*H01L 31/0352* (2006.01)

(52) U.S. Cl.
CPC .............. *H01L 31/02019* (2013.01); *H01L 31/035281* (2013.01); *H01L 31/105* (2013.01)

(56) References Cited

U.S. PATENT DOCUMENTS

| | | | |
|---|---|---|---|
| 5,187,380 A | 2/1993 | Michon et al. | |
| 5,629,517 A | 5/1997 | Jackson et al. | |
| 6,114,737 A | 9/2000 | Tonai | |
| 6,252,287 B1 * | 6/2001 | Kurtz | H01L 31/0735 257/431 |
| 6,458,619 B1 | 10/2002 | Irissou | |
| 6,566,722 B1 | 5/2003 | Lin et al. | |
| 7,138,697 B2 | 11/2006 | Chu et al. | |
| 7,141,826 B2 | 11/2006 | Ko et al. | |
| 10,854,646 B2 * | 12/2020 | Geske | H01L 31/105 |
| 11,189,741 B2 * | 11/2021 | Zhang | H01L 27/14643 |
| 11,296,139 B2 * | 4/2022 | Jeon | H01L 31/02322 |
| 11,322,652 B2 * | 5/2022 | Volkova | H01L 31/035281 |
| 2002/0006694 A1 | 1/2002 | Kawahara | |
| 2003/0127655 A1 | 7/2003 | Choi et al. | |
| 2003/0183855 A1 | 10/2003 | Dries et al. | |
| 2004/0003838 A1 | 1/2004 | Curtin | |
| 2005/0268963 A1 | 12/2005 | Jordan et al. | |
| 2006/0091407 A1 | 5/2006 | Ko et al. | |
| 2006/0091489 A1 | 5/2006 | Cheng et al. | |
| 2006/0118896 A1 | 6/2006 | Kang et al. | |
| 2007/0012948 A1 * | 1/2007 | Dries | H01L 31/02327 257/438 |
| 2007/0264835 A1 * | 11/2007 | Iguchi | H01L 31/1035 257/E27.129 |
| 2008/0083963 A1 | 4/2008 | Hsu et al. | |
| 2009/0016200 A1 | 1/2009 | Tomomatsu et al. | |
| 2009/0038669 A1 | 2/2009 | Atanackovic | |
| 2009/0277504 A1 | 11/2009 | Yamazaki | |
| 2009/0293954 A1 | 12/2009 | Yamazaki | |
| 2010/0032003 A1 | 2/2010 | Korman | |
| 2010/0044677 A1 | 2/2010 | Nagai | |
| 2010/0213565 A1 | 8/2010 | Bui et al. | |
| 2010/0258707 A1 * | 10/2010 | Inada | H01L 27/14649 257/443 |
| 2010/0282310 A1 | 11/2010 | Tsoi et al. | |
| 2011/0193133 A1 | 8/2011 | Ogura | |
| 2011/0291103 A1 | 12/2011 | Mazzillo | |
| 2012/0028399 A1 | 2/2012 | Moslehi et al. | |
| 2012/0122272 A1 | 5/2012 | Rana et al. | |
| 2012/0171804 A1 | 7/2012 | Moslehi et al. | |
| 2012/0225515 A1 | 9/2012 | Moslehi et al. | |
| 2013/0164883 A1 | 6/2013 | Moslehi et al. | |
| 2015/0056742 A1 | 2/2015 | Rana et al. | |
| 2015/0075595 A1 | 3/2015 | Gall | |
| 2015/0325726 A1 | 11/2015 | Iguchi | |
| 2015/0349156 A1 | 12/2015 | Goda et al. | |
| 2015/0372181 A1 | 12/2015 | Kobayashi et al. | |
| 2016/0013334 A1 | 1/2016 | Hwang et al. | |
| 2016/0093763 A1 | 3/2016 | Rana et al. | |
| 2016/0118514 A1 | 4/2016 | Li | |
| 2018/0033880 A1 | 2/2018 | Chen et al. | |
| 2018/0342629 A1 | 11/2018 | Yamanaka et al. | |
| 2019/0198701 A1 | 6/2019 | Moussy | |
| 2019/0288026 A1 | 9/2019 | Von Kaenel | |
| 2020/0168758 A1 | 5/2020 | Aliane et al. | |
| 2022/0102410 A1 * | 3/2022 | Chen | H01L 27/1461 |

FOREIGN PATENT DOCUMENTS

| | | |
|---|---|---|
| WO | 2009025048 A1 | 2/2009 |
| WO | 2018158631 A1 | 9/2018 |

OTHER PUBLICATIONS

Notification of Transmittal of the International Search Report and the Written Opinion of the International Searching Authority, of the Declaration for PCT/US2019/56685 dated Jan. 10, 2020.

"Extended European Search Report Received dated Mar. 1, 2022", 6 pages.

* cited by examiner

PIN PHOTODETECTOR

TECHNICAL FIELD

The invention relates generally to photodetectors, and in particular to PIN-type photodetectors utilized in optical detection systems.

BACKGROUND

Photodetectors operate to convert incident light into an electrical response. A commonly utilized type of photodetector is the PIN diode or photodetector, which comprises an undoped or lightly doped intrinsic semiconductor region located between p-type and n-type semiconductor regions (hence the name P-I-N photodiode). To operate as a photodetector, the PIN diode is reverse biased to create a depletion region located largely within the intrinsic region of the PIN diode. Under reverse bias, the PIN diode does not conduct except for an undesirable "dark current" that results from the spontaneous creation of electron-hole pairs. Light incident to the intrinsic region of the PIN diode creates an electron-hole pair within the intrinsic region. The reverse bias field of the depleted region sweeps the carriers out of the region via a mechanism known as "drift", or a process of "diffusion" in the undepleted region, wherein the collection of the charge carriers creates an electrical response (e.g., current) detectable by downstream signal processing devices.

Typical designs of PIN photodetectors for use in optical detection systems focus on the efficiency with which the photodetector converts incident light to a detectable electrical response, reducing the capacitance of the PIN photodetector, reducing the series resistance of the PIN photodetector as seen by downstream components, increasing the response time and reducing noise (e.g., leakage/dark current) generated by the PIN photodetector. Some of these design goals are in conflict with one another. For example, a reduction in capacitance is typically achieved by increasing the thickness of the intrinsic region. However, an increase in the thickness of the intrinsic region results in an increase in noise as a result of increased bulk intrinsic material that leads to an increase in dark current generated by the spontaneous generation of electron-hole pairs within the intrinsic region.

It would therefore be beneficial to provide a PIN photodetector that is capable of satisfying/improving the performance of PIN photodetectors.

SUMMARY

According to some aspects, the present disclosure describes a PIN photodetector that includes an n-type semiconductor layer, an n-type semiconductor cap layer, a first plurality of p-type region located within the n-type semiconductor cap layer and separated from one another by a distance $d_1$, and an absorber layer located between the n-type semiconductor layer and the n-type semiconductor cap layer including the first plurality of p-type regions. The plurality of p-type regions are electrically connected to one another to provide an electrical response to light incident to the pin photodetector.

According to some aspects, an optical detection system includes a PIN photodetector and a signal conditioning circuit connected to receive the electrical response generated by the PIN photodetector. In some aspects, the PIN photodetector includes an n-type semiconductor layer, a n-type semiconductor cap layer, a plurality of p-type diffusion regions diffused within the n-type semiconductor cap layer and separated from one another by a distance $d_1$, an absorber layer located between the n-type semiconductor layer and the n-type semiconductor cap layer. The plurality of p-type diffusion regions generate a plurality of depletion regions within the absorber layer, wherein each of the depletion regions are separated from adjacent depletion regions by a distance $d_3$.

DETAILED DESCRIPTION

This disclosure is directed to a PIN photodetector that utilizes a plurality of p-type semiconductor regions separated from one another. A typical PIN photodetector comprising a p-type semiconductor region and an n-type semiconductor region separated by an intrinsic semiconductor region (hence the name P-I-N). The typical PIN photodetector relies on a p-type semiconductor region that is approximately equal in size to the optical detection area. This disclosure describes a PIN photodetector that includes a plurality of p-type semiconductor regions. In some embodiments the plurality of p-type semiconductor regions are separated by a distance d. In some embodiments the plurality of p-type semiconductor regions are separated from one another—as a plurality of islands. In some embodiments the plurality of p-type semiconductors are connected to one another (for example, as a plurality of p-type rows extending from a base, wherein the rows are separated from one another by a distance). As described in more detail below, dividing the p-type semiconductor region into a plurality of individual p-type semiconductor regions provides a number of advantages, including low capacitance, low resistance, and low noise. In some embodiments, the distance between the p-type semiconductor regions is selected based on the bandwidth and/or rise time associated with downstream components of the optical detection system.

Figure 1A:
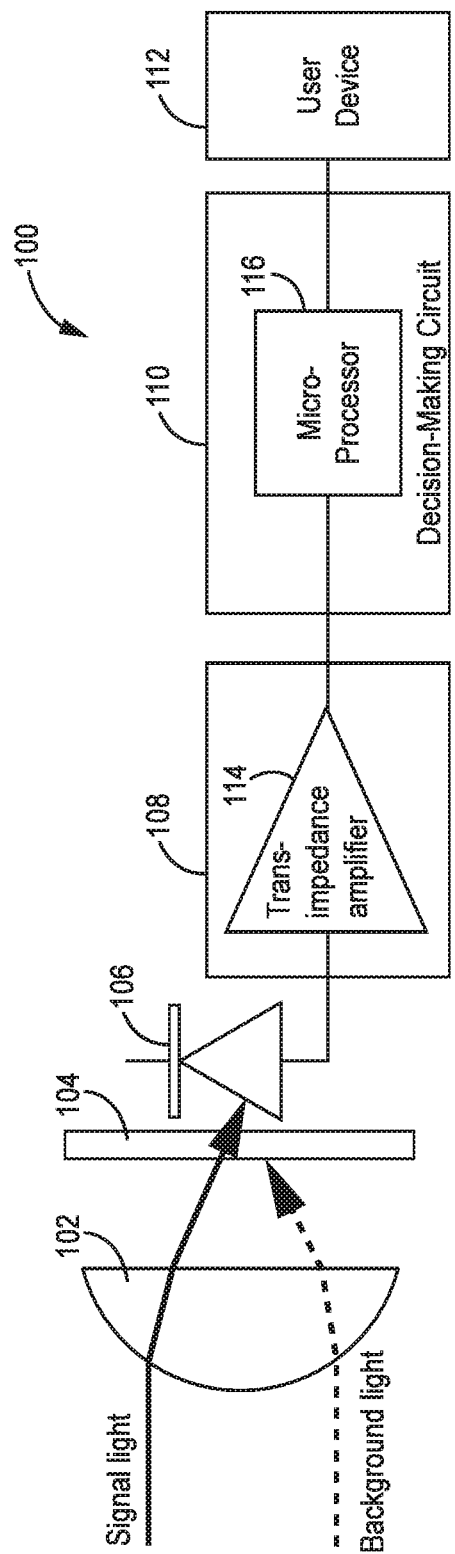
FIGS. 1A and 1B are block diagrams of a light detection system utilizing a PIN photodetector according to some embodiments.
Figure 1B:
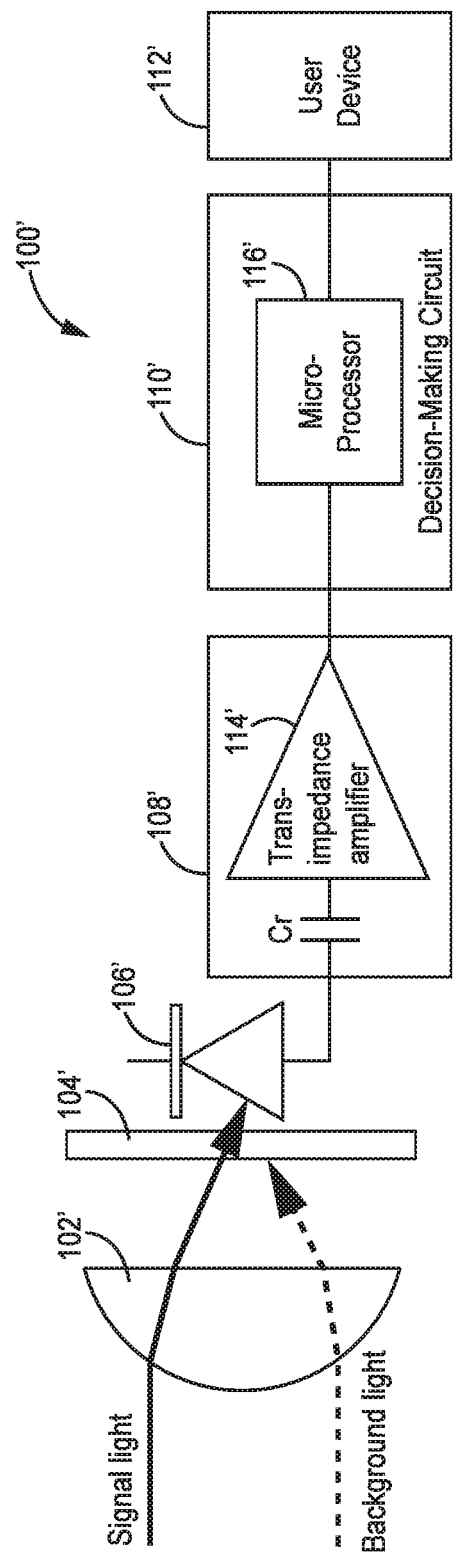

FIGS. 1A and 1B are simple views of an optical detection systems 100 and 100', respectively, utilizing a PIN photodetector according to some embodiments. In the embodiment shown in FIG. 1A, optical detection system 100 includes focusing lens 102, filter 104, photodetector 106, signal conditioning circuit 108, decision-making circuit 110 and user device 112. The embodiment shown in FIG. 1B is substantially the same as the embodiment shown in FIG. 1A, wherein the optical detection system 100' includes focusing lens 102', filter 104', photodetector 106', signal conditioning circuit 108', decision-making circuit 110' and user device 112'. In addition, optical detection system 100' includes a direct current (DC) blocking capacitor at the input of signal conditioning circuit 108'.

In some applications the optical detection systems 100 and 100' are utilized to detect a modulated light input. Modulated light sources may include light sources generated by one or more of Super luminescent Light Emitting Diodes (SLEDs), light-emitting diodes (LEDs), laser diodes, vertical-cavity surface-emitting laser (VCSELs), solid-state lasers, and fiber lasers. Modulated light detection system 100 may be utilized in a number of applications, ranging but not limited to mobile phones, gaming systems, autonomous and semi-autonomous ground and aerial vehicles, military laser warning and event detection systems. Depending on the application the modulated light detection system 100 may be implemented as part of a sensor utilized to initiate a response based on the timing, position, shape, direction, or frequency content of the modulated light received. In other embodiments, optical detection systems 100 and 100' may be utilized to detect non-modulated light sources.

In the embodiment shown in FIG. 1, light—including both background light and modulated light—is provided via a focusing lens 102 to filter 104, which acts to filter out or remove background light and/or other sources of unwanted light. The modulated light is provided to photodetector 106, which generates an electrical response (e.g., current pulse) in response to the incident modulated light. In a number of applications, photodetector 106 is a large area detector capable of achieving large fields of view. As discussed in more detail with respect to FIGS. 2-4 below, photodetector 106 may utilize a photodiode such as a PIN photodiode to generate the electrical response to the input modulated light. In general, it is desirable for the PIN photodiode to present a low capacitance, a low resistance, good/fast response time, and low noise. For example, the capacitance and series resistance presented by the PIN photodiode 106 define the "RC time constant" associated with the PIN photodiode 106. The RC time constant determines the speed at which current pulses can leave the photodetector 106 and flow into the amplifier. Additionally, the capacitance of the PIN photodiode combines with the total resistance of the PIN photodiode and the signal conditioning circuit 108 to form an RC time constant associated with the light detection system 100. It is therefore desirable to minimize the capacitance and the resistance of the PIN photodiode to reduce the RC time constant of the photodiode and of the light detection system.

Signal conditioning circuit 108 filters/amplifies the electrical response generated by the photodetector 106 to generate an electrical response that can be interpreted/utilized by decision-making circuit 110. For example, in the embodiment shown in FIG. 1A, signal conditioning circuits 108 utilizes one or more transimpedance amplifier 114 to filter and amplify the electrical signal received from the photodetector. In some embodiments signal conditioning circuit 108 may utilize one or more of passive filters, second and third stage amplification, active filters, level shifting, and/or additional signal conditioning/processing. In the embodiment shown in FIG. 1B, a direct current (DC) blocking capacitor $C_1$ (also referred to as an "alternating current (AC) coupling capacitor") is provided at the input of transimpedance amplifier 114 to block or filter DC signals (e.g., steady state or DC bias signals), while allowing modulated or pulsed signals to flow into the transimpedance amplifier 114.

Various attributes of the photodetector 106 determine the level of signal conditioning required. As discussed above, these include one or more of photodetector capacitance, resistance, response time (e.g., bandwidth), and noise. In general, it is desirable for the photodetector capacitance and resistance to be low, for the response time to be as fast or faster than the bandwidth of the signal conditioning circuit 108 and/or decision-making circuit 110. In some embodiments, the attributes associated with the response speed (e.g., capacitance, resistance, transit time of carriers) are selected such that the response speed of the photodetector 106 is approximately equal to the bandwidth (e.g., response speed) of downstream elements—such as the signal conditioning circuit 108 and/or decision-making circuit 110. In some embodiments, the response speed of the photodetector 106 is selected to be approximately equal to the lowest bandwidth (e.g., slowest) component included in the processing stream that includes signal conditioning circuit 108 and/or decision-making circuit 110. As described in more detail with respect to FIG. 2, below, the layout of the PIN photodetector 106 may be selected to provide the desired attributes.

In some embodiments, decision-making, circuit 110 is utilized to provide additional processing/calculations with respect to the detected modulated light signal. In some embodiments, decision-making circuit 110 includes a microprocessor 116 for analyzing the received signals. In other embodiments, one or more analog circuit, digital circuits, application-specific integrated circuits (ASICs), microprocessors, etc. may be utilized to analyze/process the received signals. In some embodiments, decision-making circuit 110 provides an output to user device 112. For example, decision-making circuit 110 may make determinations regarding distance to a detected object based on received modulated light signals, or may interpret data included in the modulated light signal. The result of the processing/calculations performed by decision-making circuit 110 may then be provided to user device 112 for display and/or action.

Figure 2:
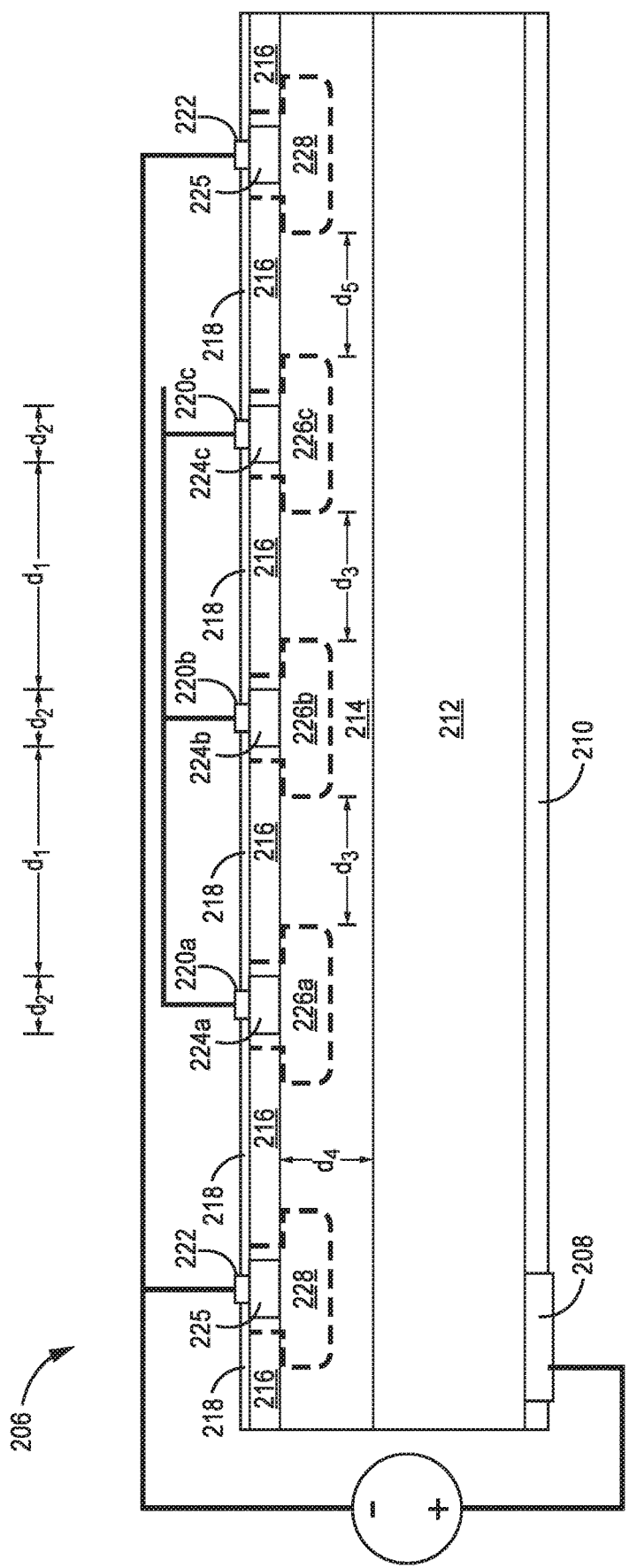
FIG. 2 is a cross-sectional view of a PIN photodetector according to some embodiments.

FIG. 2 is a cross-sectional view of a PIN photodetector 206 according to some embodiments. The PIN photodetector 206 may be utilized in conjunction with optical detection systems, such as those described with respect to FIGS. 1A and 1B above. PIN photodetector 206 may be utilized as a back-illuminated photodetector or front-illuminated photodetector. In some embodiments, the PIN photodetector 206 includes cathode contact 208, anti-reflective coating 210, n-type layer 212, absorber layer 214, n-type cap layer 216, surface passivation layer 218, anode contacts 220a, 220b, and 220b, guard ring contact 222, p-type diffusion layers 224a, 224b, and 224c, guard ring p-type diffusion 225, depleted regions 226a, 226b, and 226c, and guard ring depleted region 228.

In contrast with typical photodetectors utilizing a single, large p-type diffusion region and a resulting large depletion region for collecting charge carriers, the embodiment shown in FIG. 2 utilizes a plurality of p-type diffusion regions separated from one another by a distance. As discussed above, the term "plurality of p-type diffusion regions" includes a plurality of p-type diffusion regions separated from one another—for example as a plurality of islands. The term "plurality of p-type diffusion regions" also includes a plurality of p-type diffusion regions connected to one another—for example as a plurality of rows extending like fingers from a p-type diffusion region wherein the plurality of rows are separated from one another by a distance. As a result of the separation between the plurality of p-type diffusion regions, the depletion regions generated in response to the built-in voltage and the bias voltage in the areas surrounding the p-type diffusion regions are also separated from one another by a distance, wherein in the region separating the depletion regions the absorber layer is undepleted. Charge carriers created in response to incident photons in the undepleted regions are not subject to the built-in electric field or reverse bias field, and therefore move according to diffusion mechanisms from the undepleted region to the depleted region for collection. This is in contrast with typical PIN photodetectors, in which the design objective is for the majority of the charge carriers collected to have been created within the depletion regions and collected via "drift" mechanisms. The distance between adjacent p-type diffusions 224a, 224b, and 224c is selected such that charge carriers created in the undepleted regions of the absorber layer 214 are collected by one of the depleted regions within the time constraints of the larger overall system (e.g., based on the bandwidth and/or rise time of components associated with the signal conditioning circuit 108 and decision-making circuit 110 shown in FIG. 1). In addition, utilizing a plurality of p-type diffusion areas—instead of a single large diffusion area—decreases the area of the corresponding depletion regions 226a, 226b, and 226c as compared to a single large diffusion area and provides a corresponding decrease in the parallel plate capacitance associated with the PIN photodetector 206. In some embodiments, this allows the thickness of the absorber layer 214 to be decreased, thereby decreasing the "dark current" generated within the bulk of the absorber layer 214.

In some embodiments, the photodetector makes use of III-V type semiconductors, such as Indium-Phosphide (InP), Indium-Gallium-Arsenide (InGaAs), as well as other well-known III-V type semiconductor materials. For example, in some embodiments the n-type layer 212 is an InP layer, the absorber layer 214 is a lightly n-doped InGaAs layer, and the n-type cap layer 216 is an InP layer, with p-type diffusions 224a, 224b, and 224c within the n-type cap layer 216. The absorber layer 214 may also be referred to in some PIN examples as an intrinsic layer, although most photodetectors do not rely on a wholly intrinsic (i.e., undoped) semiconductor layer. In general, the intrinsic layer is lightly doped (e.g., lightly n-doped). Utilizing a lightly n-doped InGaAs layer for the absorber layer 214 allows for the depletion region to be more readily formed at a lower bias voltage.

In the embodiment shown in FIG. 2, the n-type layer 212 is separated from the n-type cap layer 216 by the absorber layer 214—which may be lightly n-doped as described above. Incident light is provided to the absorber layer 214, wherein the incident light (e.g., photons) creates electron-hole pairs (e.g., charge carriers) within the absorber layer 214. For those charge carriers that are created within one of the depletion regions 226a, 226b, and/or 226c, the built-in electric field and applied bias electric field (provided by voltage source 202) collect the charge carriers and provide them to the anode contact 220a, 220b, 220c and/or cathode contact 208. These charge carriers contribute to the electrical response generated in response to the detected photon or incident light. The mechanism for sweeping the charge carriers from the depletion region to the anode contact 220a, 220b, 220c is referred to as "drift". For those electron-hole pairs created in areas adjacent to the depletion region 226a, 226b, and 226c (i.e., the undepleted regions), the electric field is not as strong and charge carriers diffuse for a period of time until they either recombine with one another or happen into a depletion region 226a, 226b, and 226c (or guard ring depleted region 228) which sweeps them out of the device. In particular, charge carriers that diffuse to the depletion region 226a, 226b, and 226c are swept out via the anode contacts 220a, 220b, and 220c, respectively, for collection, and therefore also contribute to the photo-generated current delivered to the terminals of the photodiode 206. As shown in FIG. 2, the anode contacts 220a, 220b, and 220c are connected together to provide a combined output to the signal conditioning circuit connected to receive the electrical response. The time it takes for charge carriers to diffuse to the depletion region for collection is referred to as the "transit time". Those charge carriers that arrive after an extended period of time may not contribute to the peak of the electrical response generated in response to the incident light. Charge carriers that recombine before reaching one of the depletion regions 226a, 226b, and/or 226c or charge carriers that diffuse to the guard ring depletion region 228 do not contribute to the photo-generated current.

Typically, photodetectors utilize a single diffused p-type region with a corresponding depletion region in order to ensure that most charge carriers created by incident photons are located within the depleted region and are therefore quickly collected via electron drift mechanisms. In contrast, PIN photodetector 206 employs two or more p-type diffusion regions (for example, p-type diffusion regions 224a-224c shown in FIG. 2), each separated from one another by a distance. In some embodiments, the distance between adjacent p-type diffusion regions (e.g., between p-type diffusion region 224a and p-type diffusion region 224b) is represented by distance $d_1$, and each p-type diffusion region is separated from adjacent p-type diffusion regions by the same distance $d_1$. As a result of the distance between adjacent p-type diffusion regions, the depleted regions 226a, 226b, 226c associated with each p-type diffusion region 224a, 224b, and 224c, respectively, are separated by a distance. For example, in the embodiment shown in FIG. 2 the adjacent depletion regions 226a, 226b, and 226c are separated by a distance $d_3$. In some embodiments, each depletion region is separated by the same distance, but this may be varied in other embodiments. As a result of utilizing a plurality of p-type diffusion areas 224a, 224b, and 224c, the photodetector 206 is characterized by undepleted regions located between adjacent depleted regions (e.g., depleted regions 226a, 226b, and 226c). Electron-hole pairs generated within the undepleted regions by an incident photon must diffuse into one of the depletion regions 226a, 226b, and/or 226c to be collected. As discussed above, the time it takes for a charge carrier to diffuse to a depleted region for collection is known as the "transit time". The transit time depends on one or more factors, such as the speed at which carriers diffuse through the undepleted regions and the length of the time the carriers will travel before recombining. Typically, the transit time for a given device is known.

In some embodiments, the distance $d_3$ between adjacent depletion regions 226a, 226b, and 226c is selected such that the transit time of charge carriers created with the undepleted regions satisfies the bandwidth requirements of downstream signal processing components (e.g., operating bandwidth). The reciprocal of bandwidth (e.g., 1/bandwidth) has units of seconds, and can therefore be compared to the transit time of the charge carriers. That is, the transit time of charge carriers must be less than the reciprocal of the bandwidth associated with one or more of the system components (e.g., signal conditioning circuit 108, decision-making circuit 110, etc.) to ensure that created charge carriers have sufficient time to diffuse into the depletion region 226a, 226b, or 226c for collection. In some embodiments the transit time of the charge carriers is selected to ensure that the charge carriers are collected in time to contribute to a useful signal response. In some embodiments, the threshold transit time is based on the rise time of the one or more downstream signal processing components, which may be approximated by the equation $$t_r = 0.35/\text{Bandwidth(Hz)} \qquad \text{Eq. 1}$$

where $t_r$ is the rise time of the circuit. Having calculated the threshold times for charge carriers to be collected—based either on the bandwidth or on the rise time of the downstream signal processing components the distance $d_3$ between adjacent depletion regions 226a, 226b, and 226c is determined such that a charge carrier located in the undepleted region (more particularly, a charge carrier located approximately in the middle of the undepleted region) is capable of diffusing an adjacent depletion region 226a, 226b, or 226c is less than or equal to the calculated threshold time. For example, if the signal conditioning circuit 108 shown in FIG. 1 operates at a bandwidth of 10 MHz, then the rise time of the circuit may be approximated as 0.035 µs. The distance $d_3$ between adjacent depletion regions 226a, 226b, and 226c is selected such that a charge carrier formed within the undepleted region (e.g., halfway between adjacent depletion regions) will diffuse to an adjacent depletion region in approximately 0.035 µs or less. For example, the selection criteria for the distance $d_3$ may be expressed as follows:

$$d_3 < 2*(1/\text{bandwidth})*(\text{diffusion speed}) \qquad \text{Eq. 2}$$

wherein d is the distance between adjacent depletion regions associated with the p-type diffusion regions, bandwidth is the operating bandwidth of downstream electrical components, and diffusion speed is the mean velocity of charge carriers diffusing through undepleted regions. If utilizing the rise time, Eq. 2 could be re-written as:

$$d_3 < 2*(0.35/\text{bandwidth})*(\text{diffusion speed}) \qquad \text{Eq. 3}$$

This ensures that the collected charge carriers contribute to the peak signal provided to the downstream processing components (e.g., signal conditioning circuit, etc.). In this way, while the charge carriers are not collected as fast as possible from the photodetector 206 because they rely on diffusion mechanisms rather than drift mechanisms, the charge carriers are collected fast enough for the carriers to be included in the downstream signal.

In some embodiments, the distance $d_3$ between adjacent depletion regions 226a, 226b, and 226c is a function of both the distance between adjacent p-type diffusion regions 224a, 224b, 224c and the reverse bias voltage applied. The distance between p-type diffusion regions 224a, 224, and 224c cannot be modified after fabrication. However, the reverse bias voltage may be modified during operation to selectively increase/decrease the distance $d_3$ between depletion regions 226a, 226b, and 226c as required. In some embodiments, the distance $d_5$ between guard ring depletion region 228 and adjacent depletion regions (e.g., depletion region 226c) may be approximately equal to the distance $d_3$ between adjacent depletion regions. In other embodiments, the distance $d_5$ may be greater than or less than the distance $d_3$.

As a result of the distance $d_3$ between the depletion regions 226a, 226b, and 226c, a large area of the PIN photodetector 206 is dominated by diffusion mechanics, rather than drift mechanics. This is in contrast with typical PIN photodetectors, which are designed with large depletion areas to maximize drift mechanics.

In some embodiments, a benefit of the reduction in size of the depleted regions 226a, 226b, and 226c is a reduction in size of the p-type diffusion areas 224a, 224b, and 224c, which in turn reduces the junction area and hence the total area of the parallel plate capacitor formed by the junction. As a result, the photodetector 206 operates as a large area detector but provides very good (e.g., low) capacitance. In some embodiments, the decrease in capacitance provided by the decrease of the total area of the parallel plate capacitor allows for the thickness $d_4$ of the absorber layer 214 to be decreased as compared with typical PIN photodetectors. For example, in some embodiments the thickness $d_4$ of the absorber layer 214 is approximately 3 µm, although other thicknesses may be utilized depending on the application. As discussed above, the bulk associated with the absorber layer 214 is a factor in the magnitude of dark currents generated by the photodetector 206. Decreasing the thickness $d_4$ of the absorber layer 214 will therefore provide a decrease in magnitude of generated dark currents and will therefore decrease the noise associated with the photodetector 206.

In some embodiments, the anode contacts 220a, 220b, and 220c are thin Titanium (Ti) and Gold (Au) "wires" fabricated on top of the corresponding p-type diffusion areas 224a, 224b, and 224c. In other embodiments, the "wires" may be fabricated using various other conductive materials, including polysilicon and/or Indium:Tin:Oxide materials. The location of the anode contacts 220a, 220b, and 220c reduces the resistance associated with the PIN photodetector 206. Typically, the distance a charge carrier must traverse through the p-type diffusion layer contributes to the resistance provided by the photodetector. In a typical front-illuminated PIN photodetector, to avoid the anode contact shadowing the detector area, the anode contacts are located to one side, or as a ring around the single, large p-type diffusion area, which increases the resistance associated with the front illuminated photodiode. In contrast, PIN photodiode 206 shown in FIG. 2 locates the anode contacts 220a, 220b, and 220c in the approximate middle of the narrow p-type diffusion regions 224a, 224b, and 224c, which decreases the distance traveled across the diffusion region. In this way, PIN photodiode 206 provides a relatively low resistance, in particular as compared with a typical front-illuminated PIN photodiode. In some embodiments, the location of anode contacts 220a, 220b, and 220c relative to p-type diffusion areas 224a, 224b, and 224c, respectively, and the relatively short distance charge carriers must travel across the p-type diffusion areas 224a, 224b, and 224c provides relatively low photodetector resistance.

In some embodiments, the PIN photodetector 206—utilizing a plurality of p-type diffusion regions 224a, 224b, and 224c separated from one another by a distance $d_1$—provides low resistance, low dark current noise, and low capacitance. As a result, photodetector 206 employed in an optical detection system—such as that shown in FIGS. 1A and 1B—provides good overall signal-to-noise ratio. In addition, the low capacitance presented by the PIN photodetector 206 provides better noise performance and bandwidth performance for the amplifier (e.g., transimpedance amplifier utilized by signal conditioning circuit 108 shown in FIG. 1) utilized to amplify the signals provided by the photodetector 206. In addition, the PIN photodetector 206 may be utilized as a back illuminated photodetector (light incident on anti-reflective coating 310) or as a front illuminated photodetector (light incident on surface passivation layer 318).

In some embodiments, a guard ring is provided around the outer perimeter of the plurality of p-type diffusion areas 224a, 224b, and 224c. In some embodiments, the guard ring includes a guard ring contact 222 and a guard ring p-type diffusion region 225. The guard ring contact 222 is connected to the voltage source to reverse bias the junctions associated with the guard ring, thereby creating a plurality of guard ring depletion regions 228 surrounding the plurality of depletion regions 226a, 226b, and 226c. The purpose of the guard ring is to collect spontaneously generated charge carriers, thereby preventing them from being collected by the one or more depletion regions associated with p-type diffusion regions 224a, 224b, and 224c, thereby preventing the spontaneously created charge carriers from contributing to the electrical response. In some embodiments, the guard ring prevents charge carriers created far from the depleted regions 226a, 226b, and 226c from diffusing to the depleted regions and being collected—thereby contributing to an electrical response that lags behind the peak electrical response (e.g., slows the response time of the PIN photodetector). In some embodiments, the depletion region 226c and guard ring depletion region 228 are separated by distance $d_5$. In some embodiments the distance $d_5$ is approximately equal to the distance $d_3$ defined between adjacent depletion regions 226a and 226b. In other embodiments, the distance $d_5$ may be greater than or less than the distance $d_3$.

Figure 3:
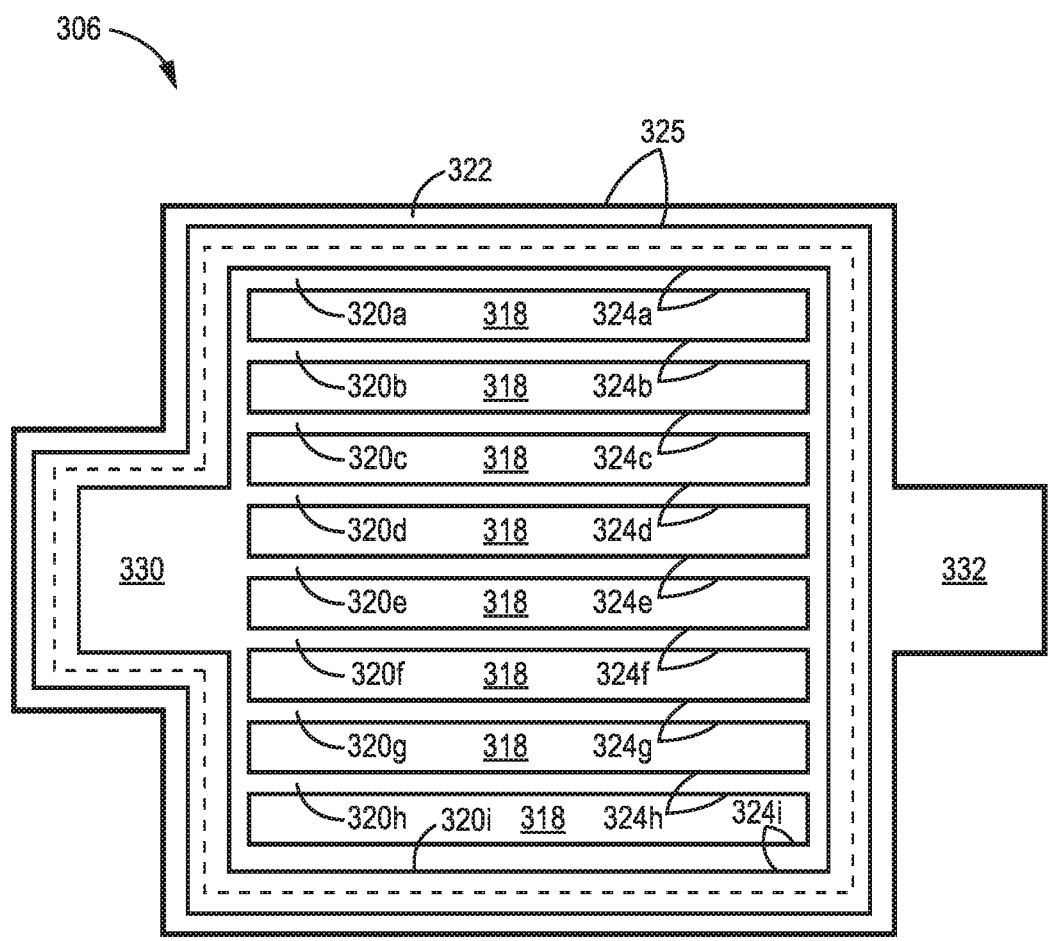
FIG. 3 is a top view of a PIN photodetector according to some embodiments.

FIG. 3 is a top view of a PIN photodetector 306 according to some embodiments. Visible in the embodiment shown in FIG. 3 is surface passivation layer 318, a plurality of anode contacts 320a-320i, each located on top of one of a plurality of p-type diffusion regions 324a-324i, respectively. The n-type substrate, absorber layer, and depletion regions are not visible. In the embodiment shown in FIG. 3, each of the plurality of anode contacts 320a-320i is in electrical communication with contact pad 330. In this way, charge carriers collected by p-type diffusion regions 324a-324i are communicated via the plurality of anode contacts 320a-320i to contact pad 330. In turn, contact pad 330 may be connected via a number of well-known means (e.g., solder bump for flip-chip, wire, tab, etc.) to a chip packaging or directly to one or more downstream components (e.g., signal conditioning circuit). Dashed line is utilized to depict the effective boundary of the photodiode optical collection area where optically or spontaneously generated carriers are approximately as likely to arrive to the downstream components as to the guard ring.

In some embodiments, a guard ring is provided around the outer periphery of the plurality of p-type diffusion regions 324a-324i. The guard ring includes guard ring contact 322, guard ring p-type diffusion layer 325, and guard ring pad 332. In some embodiments, guard ring pad 332 may be connected via a number of well-known means (e.g., solder bump, wire, tab, etc.) to a chip packaging or directly to the ground of the voltage source utilized to reverse bias the photodiode. In this way, charge carriers collected by the guard ring are not included in the electrical response provided to downstream signal conditioning circuits.

In the embodiment shown in FIG. 3, in the area located within the dashed line and excluding the contact pad 330, a larger percentage of the area is dedicated to the undiffused n-type InP cap layer 216 than to the p-type diffusion regions 324a-324i. As a result, in some embodiments a larger percentage of the absorber layer is undepleted than depleted, meaning that a larger percentage of the absorber layer is dominated by diffusion transit mechanisms than by drift transit mechanisms. In other embodiments, the percentage of depleted region and the percentage of undepleted regions may vary depending on the particular application.

A benefit of the embodiment illustrated in FIG. 3 is that fabrication is relatively straight-forward, wherein p-type diffusion regions are diffused into the n-type cap layer. Long, thin metal contact wires are placed over the diffused areas to connect the diffused areas to the contact pad 330. The use of thin metal contact wires 320a-320i minimizes optical shadowing for front-illuminated devices.

Figure 4:
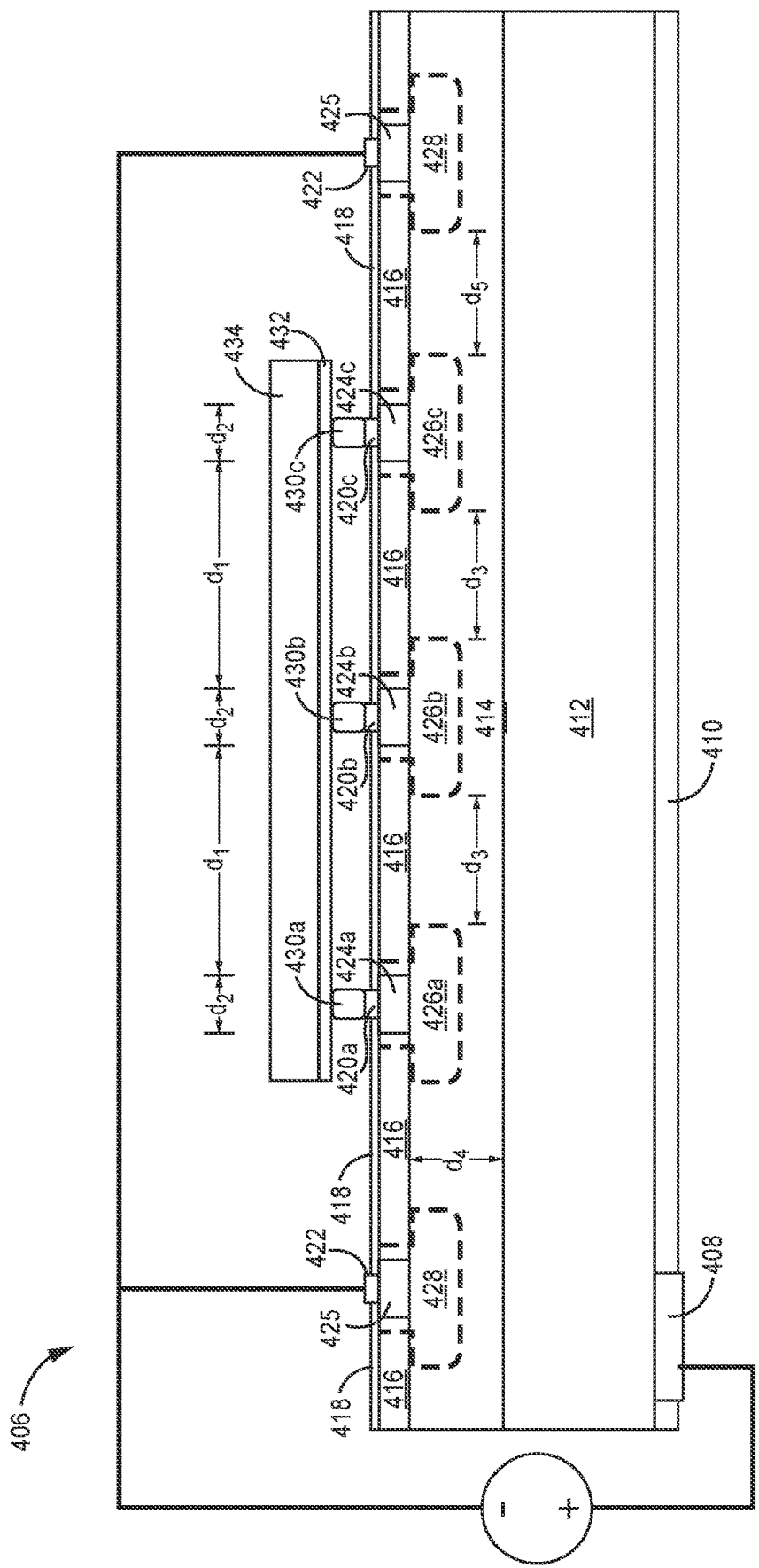
FIG. 4 is a cross-sectional view of a PIN photodetector according to some embodiments.

FIG. 4 is a cross-sectional view of a PIN photodetector 406 according to some embodiments. The PIN photodetector 406 may be utilized in conjunction with optical detection systems, such as those described with respect to FIGS. 1A and 1B above. PIN photodetector 406 may be utilized as a back-illuminated photodetector or front-illuminated photodetector. In some embodiments, the PIN photodetector 406 includes cathode contact 408, anti-reflective coating 410, n-type layer 412, absorber layer 414, n-type cap layer 416, surface passivation layer 418, anode contacts 420a, 420b, and 420b, guard ring contact 422, p-type diffusion layers 424a, 424b, and 424c, guard ring p-type diffusion 425, depleted regions 426a, 426b, and 426c, guard ring depleted region 428, conductive bumps 430a, 430b, and 430c, conductive layer 432 and packaging layer 434.

As described above with respect to FIG. 2, the PIN photodetector 406 shown in FIG. 4 includes a plurality of p-type diffusion regions 424a, 424b, and 424c formed within the n-type cap layer 416. As described above, the term plurality of p-type regions includes a plurality of regions separated from one another as a plurality of islands, as well as a plurality of regions connected to one another—for example like a plurality of rows or fingers extending from a base. In each case, the plurality of p-type regions 424a, 424b, and 424c are separated from one another by a distance $d_1$. As a result of the distance between adjacent p-type diffusion regions, the depleted regions 426a, 426b, 426c associated with each p-type diffusion region 424a, 424b, and 424c, respectively, are separated by a distance. For example, in the embodiment shown in FIG. 4 the adjacent depletion regions 426a, 426b, and 426c are separated by a distance $d_3$. In some embodiments, each depletion region is separated by the same distance, but this may be varied in other embodiments. As a result of utilizing a plurality of p-type diffusion areas 424a, 424b, and 424c, the photodetector 406 is characterized by undepleted regions located between adjacent depleted regions (e.g., depleted regions 426a, 426b, and 426c). Electron-hole pairs generated within the undepleted regions by an incident photon must diffuse into one of the depletion regions 426a, 426b, and/or 426c to be collected. As discussed above, the time it takes for a charge carrier to diffuse to a depleted region for collection is known as the "transit time". The transit time depends on one or more factors, such as the speed at which carriers diffuse through the undepleted regions and the length of the time the carriers will travel before recombining. Typically, the transit time for a given device is known.

As described above, the distance $d_3$ between adjacent depletion regions 426a, 426b, and 426c is selected such that the transit time of charge carriers created with the undepleted regions satisfies the bandwidth requirements of downstream signal processing components (e.g., operating bandwidth). In some embodiments, the threshold transit time is based on the rise time of the one or more downstream signal processing components, which may be approximated by the Equation 1, provided above. The distance between adjacent depletion regions 426a, 426b. 426c may be expressed—for example—as shown in Equations 2 and 3, above, to ensure that the collected charge carriers contribute to the peak signal provided to the downstream processing components (e.g., signal conditioning circuit, etc.). In this way, while the charge carriers are not collected as fast as possible from the photodetector 406 because they rely on diffusion mechanisms rather than drift mechanisms, the charge carriers are collected fast enough for the carriers to be included in the downstream signal.

In the embodiment shown in FIG. 3, charge carriers collected by the p-type diffusion regions were communicated via conductive "wires" 320a-320i to a contact pad 330. In the embodiment shown in FIG. 4, rather than utilize a plurality of conductive "wires" fabricated on top of the p-type diffusion layers, the embodiment shown in FIG. 4 electrically connects the plurality of p-type diffusion regions 424a, 424b, and 424c outside of the PIN photodetector itself. For example, the electrical connection between the plurality of p-type diffusion regions 424a, 424b, and 424c may be made within the packaging or circuitry to which the PIN photodiode 406 is connected. In the embodiment shown in FIG. 4, conductive bumps 430a, 430b, and 430c are in contact with p-type diffusion regions 424a, 424b, and 424c, respectively. The conductive bumps 430a, 430b, and 430c may be solder bumps commonly utilized in flip chip type packaging techniques, or may include other well-known means of connecting a semiconductor device to a package and/or circuit (e.g., flip chip, ball grid array, hybridization, wire bonding, etc.). A conductive layer 432 provides a conductive path between the plurality of conductive bumps 430a, 430b, and 430c to provide an electrical response representative of charge carriers collected by the plurality of p-type diffusion regions 424a, 424b, and 424c. In some embodiments, conductive layer 432 is a plurality of conductive "wires" or traces that provide an electrical connection between the plurality of p-type diffusion regions 424a, 424b, and 424c. In other embodiments, because the plurality of p-type diffusion regions 424a, 424b, and 424c are connected together, the conductive layer 432 is a conductive sheet. In some embodiments, packaging layer 434 is an insulative layer that supports the conductive layer 432. The conductive layer 432 and/or packaging layer 434 may be included as part of a chip package, circuit board, or other off-die device to which the photodetector 406 is connected. In other embodiments, various other means of collecting and combining the charge carriers collected by p-type diffusion regions 424a, 424b, and 424c may be utilized.

Figure 5:
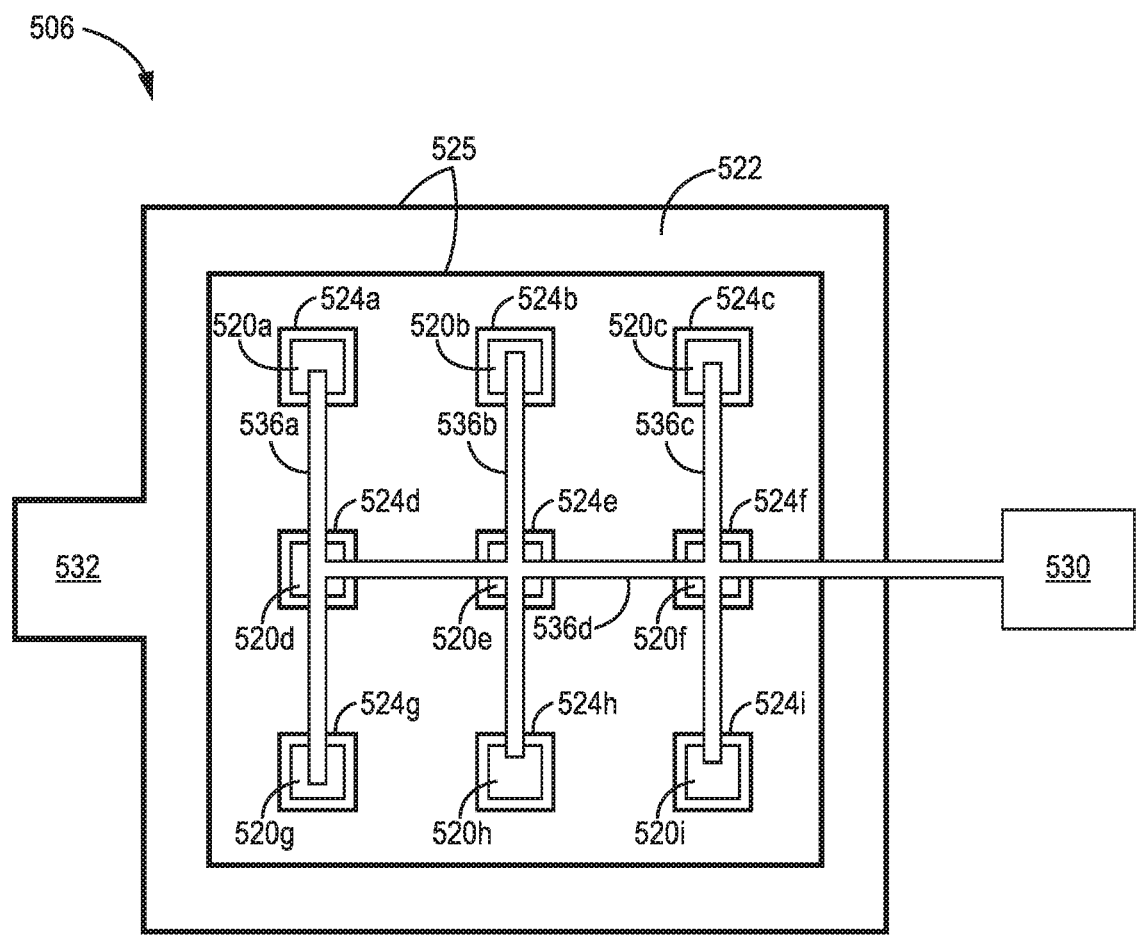
FIG. 5 is a top view of a PIN photodetector according to some embodiments.

FIG. 5 is a top view of a PIN photodetector according to some embodiments. In the embodiment shown in FIG. 5, PIN photodetector 506 includes an array of p-type diffusions 524a-524i (i.e., diffusion islands). Each of the p-type diffusions 524a-524i is connected to one another via a plurality of electrical contacts 520a-520i and a plurality of conductive "wires" 536a-536d.

In general, FIG. 5 illustrates an array of p-type diffusion islands 524a-524i that are connected to a single output provided to signal conditioning circuit (e.g., signal conditioning circuit 108 or 108' shown in FIGS. 1A and 1B). Fabrication of a PIN photodetector 506 utilizing an array of p-type diffusion islands—and in particular the conductive elements utilized to connect the array of p-type diffusion islands to one another—may utilize several configurations. In some embodiments the connection of the array of p-type diffusion islands 524a-524i to one another is provided on the semiconductor die itself, while in other embodiments the connection of the array of p-type diffusion islands 524a-524i is provided off-die. For example, in some embodiments, the connection of the array of p-type diffusions islands 524a-524i is provided in the integrated circuit or other type of packaging associated with the PIN photodetector 506, such as on the printed circuit board or ceramic packaging. For example, as described with respect to FIG. 4, a plurality of conductive bumps may be utilized, wherein a conductive bump or solder bump is formed on top of each of the plurality of electrical contacts 520a-520i, and connected together by a conductive layer. The conductive layer may be formed on an integrated circuit package, on a printed circuit board, or some other type of off-die packaging. In this way, charge carriers collected by the plurality of p-type diffusion regions 524a-524i are combined to provide an electrical response.

As described above, in some embodiments the array of p-type diffusions 524a-524i are connected to one another on-die. In one embodiment an insulating layer (not shown) such as an oxide layer is deposited on top of the InP cap layer and array of p-type diffusions 524a-524i. A plurality of vertical vias (extending into the page) are formed over each of the plurality of p-type diffusions 524a-524i, wherein the vertical vias are filled with a conductive material to provide an electrical path between the plurality of p-type diffusions 524a-524i and the vias. In some embodiments, a plurality of wires (such as those shown in FIG. 5) are utilized to connect the plurality of conductive vias together and to the contact pad 530. In other embodiments, because all of the conductive vias are to be connected to one another, a single conductive sheet may be placed on top of the insulator to connect the plurality of conductive vias to one another and to the contact pad 530. The guard ring includes guard ring contact 522, guard ring p-type diffusion layer 525, and guard ring contact pad 532.

The present disclosure therefore provides a PIN photodetector that can be utilized in an optical detection system. The PIN photodetector utilizes a plurality of p-type diffusion regions. In some embodiments the p-type diffusion regions are arranged in a plurality of rows, while in other embodiments the p-type diffusion regions are arranged as an array of p-type diffusion islands. The plurality of p-type diffusions are connected together to provide a single output, which is provided to downstream signal conditioning and processing components. In some embodiments, the distance between the plurality of p-type diffusion regions is related to the operating bandwidth of the downstream signal conditioning and processing components.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A PIN photodetector comprising:
a first semiconductor layer;
a second semiconductor cap layer;
an array of semiconductor regions located within the second semiconductor cap layer, wherein each of the semiconductor regions in the array are separated from one another by approximately the same distance $d_1$;
an absorber layer located between the first semiconductor layer and the second semiconductor cap layer including the of semiconductor regions; and
wherein one or more electrical responses are generated by the array of semiconductor regions in response to light incident to the PIN photodetector.

2. The PIN photodetector of claim 1, wherein the array of semiconductor regions is a two-dimensional array.

3. The PIN photodetector of claim 1, wherein the first semiconductor layer is an n-type semiconductor layer, the second semiconductor cap layer is an n-type semiconductor cap layer, and the array of semiconductor regions are p-type regions.

4. The PIN photodetector of claim 1, wherein the first semiconductor layer, the second semiconductor cap layer, the array of semiconductor regions, and the absorber layer are located on a first semiconductor die.

5. The PIN photodetector of claim 4, wherein connections between the array of semiconductor regions are fabricated as part of the first semiconductor die.

6. The PIN photodetector of claim 4, further including an electrical contact formed on each of the semiconductor regions included in the array of semiconductor regions.

7. The PIN photodetector of claim 6, further including conductors located on each of the electrical contacts.

8. The PIN photodetector of claim 7, further including a conductive layer connected to the array of semiconductor regions via the conductors and electrical contacts associated with each semiconductor region.

9. The PIN photodetector of claim 8, wherein the conductive layer is included as part of an off-die package.

10. The PIN photodetector of claim 9, wherein the off-die package is one of an integrated circuit package or a printed circuit board.

11. The PIN photodetector of claim 1, wherein the array of semiconductor regions generates a plurality of depletion regions within the absorber layer separated by undepleted regions within the absorber layer.

12. The PIN photodetector of claim 11, wherein adjacent depletion regions are separated by a distance $d_3$, wherein the distance $d_3$ is approximately equal to or less than a diffusion length associated with charge carriers in the absorber layer.

13. The PIN photodetector of claim 1, further including a guard ring located on a same plane as the array of semiconductor regions, wherein the guard ring surrounds the array of semiconductor regions.

14. An optical detection system comprising:
  a PIN photodetector comprising:
    an n-type semiconductor layer;
    an n-type semiconductor cap layer;
    a plurality of p-type diffusion regions diffused within the n-type semiconductor cap layer and separated from one another by a distance $d_1$, the plurality of p-type diffusion regions arranged in a two-dimensional array of p-type diffusion regions;
    an absorber layer located between the n-type semiconductor layer and the n-type semiconductor cap layer, wherein the plurality of p-type diffusion regions generate a plurality of depletion regions within the absorber layer, wherein each of the depletion regions are separated from adjacent depletion regions by a distance $d_3$; and
  a signal conditioning circuit connected to receive an electrical response generated by the PIN photodetector, wherein the signal conditioning circuit is characterized by a bandwidth.

15. The optical detection system of claim 14, wherein the distance $d_3$ between adjacent depletion regions is selected based on the bandwidth of the signal conditioning circuit and wherein the distance $d_3$ is selected such that a transit time of charge carriers created between the depletion regions is less than 1/bandwidth of the signal conditioning circuit.

16. The optical detection system of claim 14, wherein the PIN photodetector further includes a plurality of conductors in electrical contact with the plurality of p-type diffusion regions to provide the electrical response to charge carriers collected by the plurality of p-type diffusion regions.

17. The optical detection system of claim 14, wherein an electrical connection to the plurality of p-type diffusion regions is made within a packaging or carrier associated with the PIN photodetector.

18. The optical detection system of claim 14, wherein the PIN photodetector further comprises:
  a plurality of electrical contacts, each electrical contact associated with one of the p-type diffusion regions; and
  a plurality of conductors, each conductor associated with one of the plurality of electrical contacts.

19. The optical detection system of claim 18, further comprising:
  one or more conductive layers connected to the array of p-type diffusion regions via the conductors and electrical contacts associated with each p-type diffusion region, wherein the one or more conductive layers is included as part of an off-die package contacting the PIN photodetector.

\* \* \* \* \*